(12) United States Patent
Hata et al.

(10) Patent No.: US 7,938,636 B2
(45) Date of Patent: May 10, 2011

(54) INJECTION APPARATUS, SEMICONDUCTOR LIGHT EMITTING APPARATUS, MANUFACTURING APPARATUS, AND MANUFACTURING METHOD OF SEMICONDUCTOR LIGHT EMITTING APPARATUS

(75) Inventors: Toshio Hata, Mihara (JP); Hideaki Tatsuta, Higashihiroshima (JP); Hiromu Tagashira, Higashihiroshima (JP); Taiji Morimoto, Onomichi (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 195 days.

(21) Appl. No.: 11/882,598

(22) Filed: Aug. 2, 2007

(65) Prior Publication Data
US 2008/0029779 A1 Feb. 7, 2008

(30) Foreign Application Priority Data
Aug. 3, 2006 (JP) .................... 2006-212611

(51) Int. Cl.
B29C 41/36 (2006.01)
B29C 41/52 (2006.01)
B41F 15/44 (2006.01)

(52) U.S. Cl. ........ 425/110; 118/406; 101/123; 425/143; 425/147; 425/449

(58) Field of Classification Search .................. 118/663, 118/406; 257/98; 438/26; 425/110, 143, 425/147, 449; 101/123
See application file for complete search history.

(56) References Cited

U.S. PATENT DOCUMENTS

| 5,232,651 | A  | * | 8/1993 | Okuno et al. ................ | 264/251 |
| 5,309,837 | A  | * | 5/1994 | Nanzai .......................... | 101/425 |
| 5,483,879 | A  | * | 1/1996 | Tani et al. ..................... | 101/123 |
| 5,553,540 | A  | * | 9/1996 | Tani ............................. | 101/129 |
| 5,806,423 | A  | * | 9/1998 | Tani ............................. | 101/123 |
| 5,925,187 | A  | * | 7/1999 | Freeman et al. ............. | 118/667 |
| 6,216,589 | B1 | * | 4/2001 | Tani ............................. | 101/123 |
| 6,240,840 | B1 |   | 6/2001 | Murakami | |
| 6,324,973 | B2 | * | 12/2001 | Rossmeisl et al. ............ | 101/123 |
| 6,514,644 | B2 | * | 2/2003 | Yamagata et al. ............... | 430/7 |
| 6,810,798 | B2 | * | 11/2004 | Murakami et al. ............. | 101/129 |
| 6,960,878 | B2 |   | 11/2005 | Sakano et al. | |
| 7,049,159 | B2 |   | 5/2006 | Lowery | |
| 7,096,781 | B2 | * | 8/2006 | Katano et al. ................. | 101/123 |
| 2002/0185965 | A1 | | 12/2002 | Collins, III et al. | |
| 2006/0118510 | A1 | * | 6/2006 | Fujii ............................... | 216/24 |

FOREIGN PATENT DOCUMENTS

| JP | 2000-233489 | 8/2000 |
| JP | 2002-134792 | 5/2002 |
| JP | 2002-185048 | 6/2002 |
| JP | 2003-179269 | 6/2003 |
| JP | 2004-082514 | 3/2004 |
| JP | 2004-121963 | 4/2004 |
| JP | 2005-123238 | 5/2005 |

* cited by examiner

*Primary Examiner* — Robert B Davis
(74) *Attorney, Agent, or Firm* — Morrison & Foerster LLP

(57) ABSTRACT

A fluorescence-containing material injection apparatus of the present invention includes a fluorescence-containing material temperature control section, a fluorescence-containing material stirring section, a fluorescence-containing material remaining amount sensor, and a fluorescence-containing material injection amount adjustment section, by which disproportion in the mixture ratio of contaminates in a fluorescence-containing material M is restrained. This makes it possible to evenly apply a fluorescence-containing material onto a semiconductor light emitting element.

9 Claims, 7 Drawing Sheets

INJECTION APPARATUS, SEMICONDUCTOR LIGHT EMITTING APPARATUS, MANUFACTURING APPARATUS, AND MANUFACTURING METHOD OF SEMICONDUCTOR LIGHT EMITTING APPARATUS

This Nonprovisional application claims priority under 35 U.S.C. § 119(a) on Patent Application No. 212611/2006 filed in Japan on Aug. 3, 2006, the entire contents of which are hereby incorporated by reference.

FIELD OF THE INVENTION

The present invention relates to an injection apparatus which forms and shapes a florescence-containing translucent resin material around a semiconductor light emitting element, a manufacturing apparatus, and a manufacturing method of a semiconductor light emitting apparatus. The present invention is suitably used in an industrial field of apparatuses of forming and shaping a fluorescence-containing material around a semiconductor light emitting element by means of screen printing.

BACKGROUND OF THE INVENTION

There have conventionally been known semiconductor light emitting apparatuses in which a semiconductor light emitting element is covered with a fluorescence-containing material which is resin including a fluorescent material, and the fluorescent material is excited (an electron orbit changes from a low energy state to a high energy state) by ultraviolet light and/or visible light emitted from the semiconductor light emitting element so that the fluorescent material emits light. The fluorescence-containing material is formed and shaped by spin coating or screen printing. By the spin coating, however, the maximum layer thickness of the fluorescence-containing material is limited to around 100-900 µm, and the fluorescence-containing material can be formed and shaped only on the upper surface of the substrate. On the other hand, by the screen printing, the fluorescence-containing material can be formed and shaped not only on the upper surface of the substrate but also around the periphery of the substrate, and the fluorescence-containing material can be evenly formed and shaped with the layer thickness of 0.3 to 0.5 mm.

The screen printing is concretely disclosed in the patent document 1 (Japanese Laid-Open Patent Application No. 2002-185048; published on Jun. 28, 2002) and the patent document 2 (Japanese Laid-Open Patent Application No. 2004-82514; published on Mar. 18, 2004). That is to say, the patent documents 1 and 2 disclose a method such that a screen plate is provided on an application target, and an applied material on the screen plate is pushed out through holes made through the screen plate and applied to the application target. Japanese Laid-Open Patent Application No. 2000-233489 (published on Aug. 29, 2000) discloses a method such that a rubber pallet termed squeegee is moved back and forth so that an applied material provided on a screen plate is pushed though holes of the screen plate and applied to an application target.

As discussed above, comparing the spin coating and the screen printing, the screen printing is advantageous for forming and shaping a fluorescence-containing material. For this reason, the screen printing is widely used for forming and shaping a fluorescence-containing material around a semiconductor light emitting element.

Formation and shaping of a fluorescence-containing material around a semiconductor light emitting element is disclosed in the patent document 4 (Japanese Laid-Open Patent Application No. 2003-179269; published on Jun. 27, 2003), the patent document 5 (Japanese Laid-Open Patent Application No. 2002-134792; published on May 10, 2002), and the patent document 6 (Japanese Laid-Open Patent Application No. 2005-123238; published on May 12, 2005). More specifically, the patent document 4 discloses a method to form and shape a fluorescence-containing material by using a mask as the screen plate. The patent document 5 disclose a method to form and shape a fluorescence-containing material by using a metal mask as the screen plate. The patent document 6 discloses a method such that a semiconductor light emitting element is provided at the center of each of plural openings made through a screen plate termed stencil, the stencil is removed after the openings are filled with a fluorescence-containing material, and the fluorescence-containing material is hardened so that the fluorescence-containing material is formed and shaped around the semiconductor light emitting element.

The following will closely discuss the method of manufacturing a semiconductor light emitting apparatus recited in the patent document 6, with reference to FIG. 8. FIG. 8 is a cross section of the semiconductor light emitting apparatus, for describing the manufacturing method of the patent document 6. As shown in FIG. 8, the manufacturing method of the patent document 6 is arranged such that, in order to cover a light emitting surface of a semiconductor light emitting element 100 with a fluorescent layer 102, a fluorescent layer forming template (stencil) 101 having openings 103 which are used for forming the fluorescent layer 102 is provided on a substrate 104 on which the semiconductor light emitting element 100 is mounted. Then the openings 103 of the fluorescent layer forming template 101 are filled with a fluorescence-containing material, the filled fluorescence-containing material is hardened, and the fluorescent layer forming template 101 is removed from the substrate 104. As a result, the fluorescent layer 102 is formed.

However, in an apparatus which forms and shapes a fluorescence-containing material around a semiconductor light emitting element by the screen printing disclosed by the patent document 1, 2, 3, 4, or 5, the viscosity of the fluorescence-containing material significantly varies in accordance with the ambient temperature, and a sedimentation condition of sediment in the fluorescence-containing material also varies (i.e. a fluorescent material with a high gravity settles down). The sediment is kept settled down if the fluorescence-containing material is not stirred. As a result, the density of the fluorescence-containing material becomes uneven, and hence the fluorescence-containing material applied around the semiconductor light emitting element does not have an even mixture ratio. On this account, color and light emission of a semiconductor light emitting apparatus which emits light by the semiconductor light emitting element are uneven.

In the meanwhile, the semiconductor light emitting apparatus recited in the patent document 6 uses, for injection, a fluorescence-containing material whose viscosity is varied and hence the mixture ratio is disproportionate. On this account, bubbles may enter or be generated in a space between the fluorescence-containing material and the semiconductor light emitting element. As a result, the fluorescence-containing material injected to the opening of the stencil may be deformed and bubbles may be generated in the fluorescence-containing material.

SUMMARY OF THE INVENTION

The objective of the present invention is to provide an injection apparatus which makes it possible to evenly apply a fluorescence-containing material to a semiconductor light emitting element, a manufacturing apparatus, and a method of manufacturing the semiconductor light emitting apparatus.

To achieve the objective above, an injection apparatus of the present invention, which is used for a manufacturing apparatus which applies, by screen printing, a fluorescence-containing material including a fluorescent material and resin onto a semiconductor light emitting element in a package of a semiconductor light emitting apparatus, the injection apparatus injecting the fluorescence-containing material into a shaping template for the screen printing, includes at least one equalization section which restrains disproportion in a mixture ratio of contaminants in the fluorescence-containing material.

Also, to achieve the objective above, a method of manufacturing a semiconductor light emitting apparatus of the present invention, which applies a fluorescence-containing material including a fluorescent material and resin onto a semiconductor light emitting element in a package of a semiconductor light emitting apparatus, includes the step of: (i) restraining, by an equalization section, disproportion in a mixture ratio of contaminants in the fluorescence-containing material which is injected by an injection apparatus to a shaping template for screen printing, the equalization section being included in the injection apparatus.

According to the present invention, since equalization sections for restraining disproportion in the mixture ratio of the contaminants in the fluorescence-containing material are included, it is possible to keep the mixture ratio of the contaminants in the fluorescence-containing material to be constant. Therefore, it is possible to inject the fluorescence-containing material with a uniform mixture ratio into the shaping template for screen printing, which is used for a manufacturing apparatus for screen printing, which apparatus applies a fluorescence-containing material to a semiconductor light emitting element in a package of a semiconductor light emitting apparatus. It is therefore possible to evenly apply the fluorescence-containing material to the semiconductor light emitting element. As a result, it is possible to restrain the decrease in chromaticity yield and to provide a semiconductor light emitting apparatus which can emit uniform light and is almost free from color irregularity.

To achieve the objective above, a manufacturing apparatus of the present invention, which applies, by screen printing, a fluorescence-containing material which is resin including a fluorescent material onto a semiconductor light emitting element in a package of a semiconductor light emitting apparatus, includes: a shaping template for the screen printing; and one of the foregoing injection apparatuses.

This makes it possible to evenly apply the fluorescence-containing material to the semiconductor light emitting element.

Additional objects, features, and strengths of the present invention will be made clear by the description below. Further, the advantages of the present invention will be evident from the following explanation in reference to the drawings.

DESCRIPTION OF THE EMBODIMENTS

The following will discuss an embodiment of the present invention with reference to FIGS. 1-7(f). In the figures referred to in the description, the same members and functions have the same reference numbers, and detailed descriptions thereof are not repeated.

Figure 2:
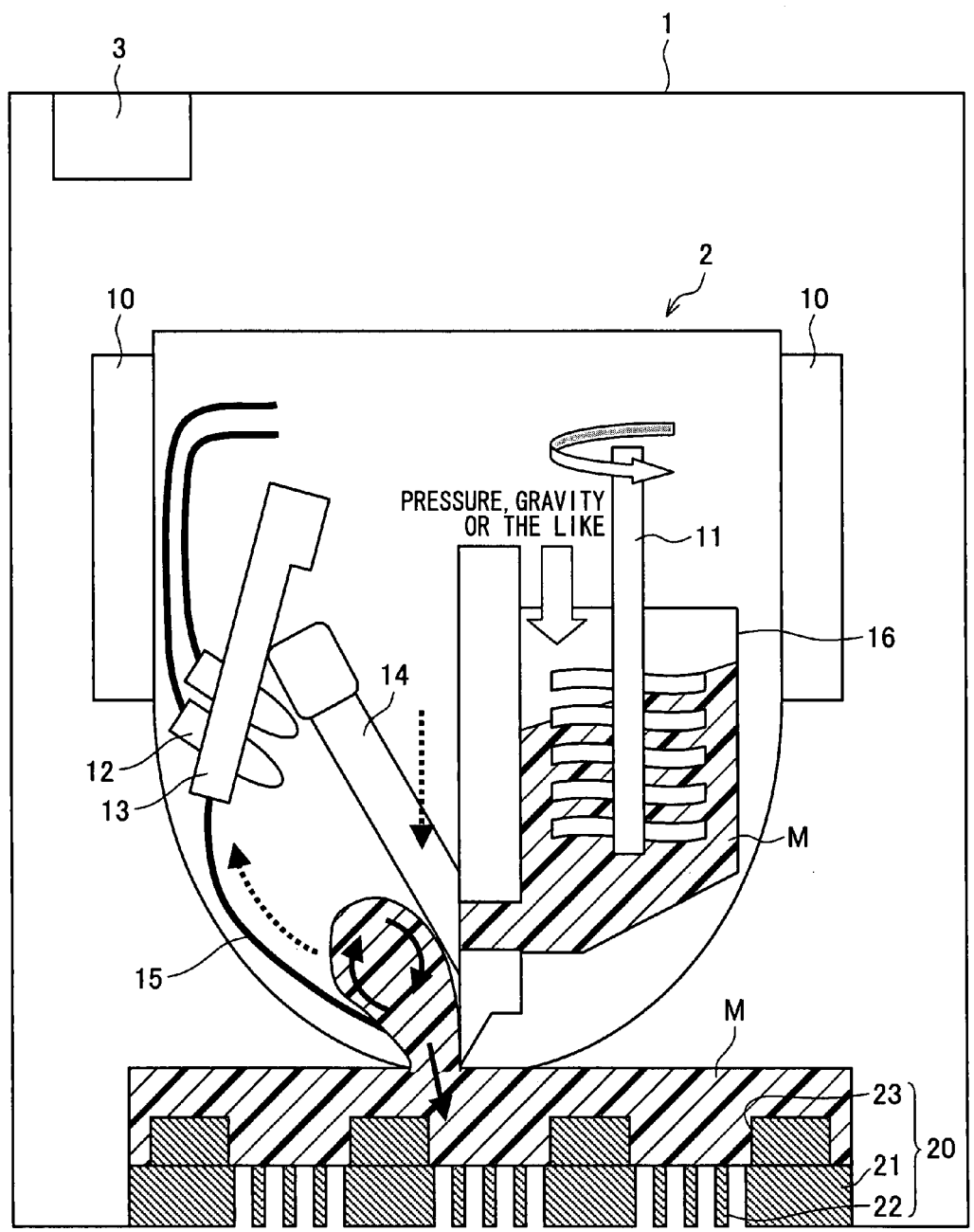
FIG. 2 outlines an embodiment of a semiconductor light emitting apparatus manufacturing apparatus of the present invention.

Referring to FIG. 2, discussed first is an outline of a semiconductor light emitting apparatus manufacturing apparatus 1. FIG. 2 outlines the semiconductor light emitting apparatus manufacturing apparatus 1 of the present embodiment. As shown in this figure, the semiconductor light emitting apparatus manufacturing apparatus 1 of the present embodiment includes a fluorescence-containing material injection apparatus (injection apparatus) 2, pressure device (pressure adjustment device) 3, and a quantitative template (shaping template) 20. In the semiconductor light emitting apparatus manufacturing apparatus 1, the fluorescence-containing material injection apparatus 2, the pressure device 3, and the quantitative template 20 are provided in an enclosed space such as a single enclosed housing.

The fluorescence-containing material injection apparatus 2 injects a fluorescence-containing material M into a below-mentioned quantitative template 20. The fluorescence-containing material M will also be discussed later. Furthermore, details of the fluorescence-containing material injection apparatus 2 will be given later.

The pressure device 3 changes gas pressure in the enclosed space in which the fluorescence-containing material injection apparatus 2, the pressure device 3, and the quantitative template 20 are provided. An example of the pressure device 3 is an airbag. In case where an airbag is adopted as the pressure device 3, gas pressure in the enclosed space is increased by inflating the airbag, whereas gas pressure in the enclosed space is decreased by deflating the airbag.

The quantitative template 20 is a template to quantitatively forms the fluorescence-containing material M around a below-discussed semiconductor light emitting element 37 by the screen printing. Details of the quantitative template 20 will be given later.

Figure 1:
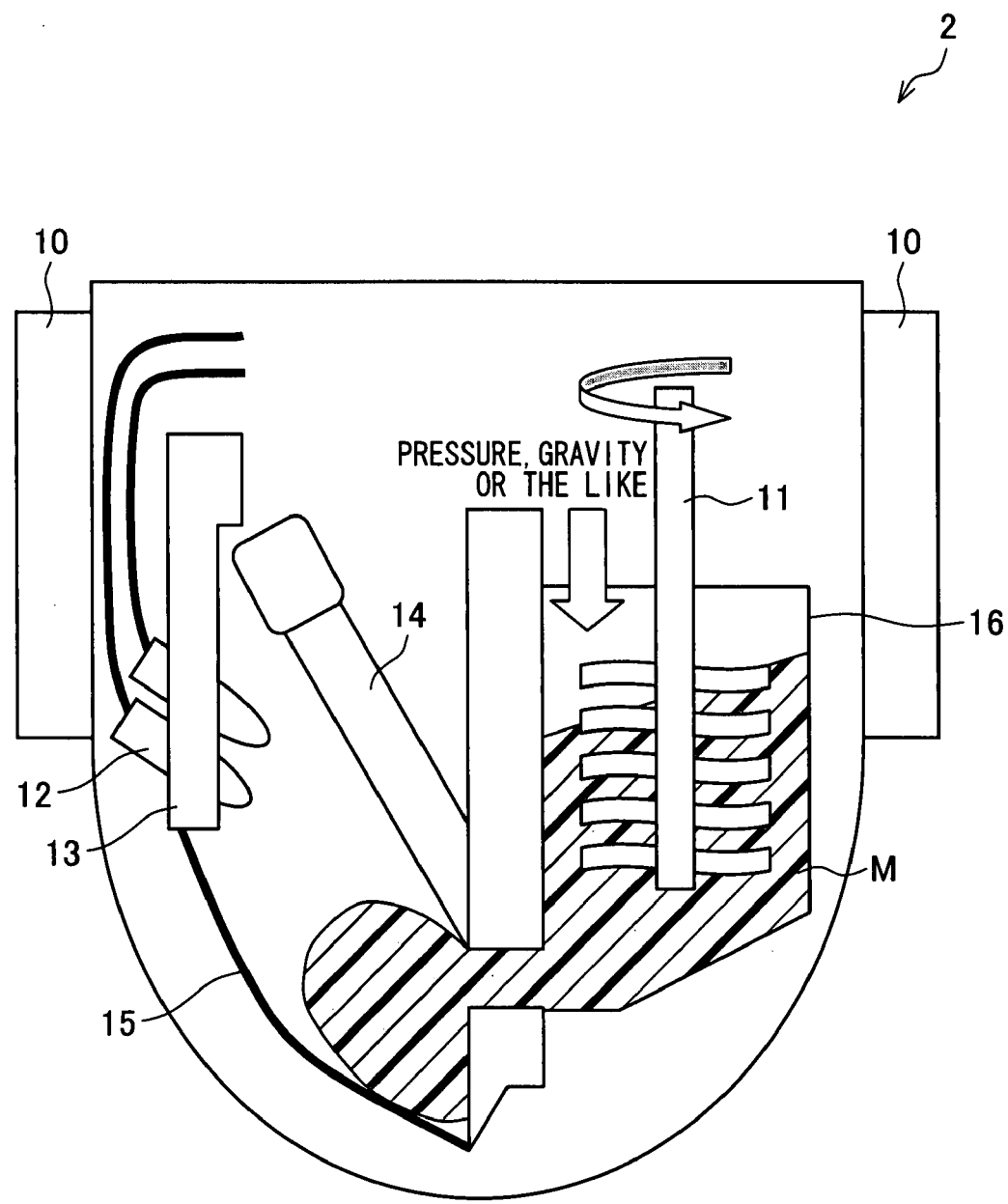
FIG. 1 outlines an embodiment of a fluorescence-containing material injection apparatus of the present invention.

The fluorescence-containing material injection apparatus 2 will be outlined with reference to FIG. 1. FIG. 1 schematically illustrates the fluorescence-containing material injection apparatus 2 of the present embodiment. As shown in FIG. 1, the fluorescence-containing material injection apparatus 2 of the present embodiment includes a fluorescence-containing material temperature control section (equalization section, temperature control section) 10, a fluorescence-containing material stirring section (equalization section, stirring section) 11, a fluorescence-containing material remaining amount detection section (equalization section, remaining amount detection section) 12, a fluorescence-containing material injection amount adjustment section (equalization section, material injection amount adjustment section) 13, a squeegee 14, a valve 15, and a storage section 16.

The fluorescence-containing material temperature control section 10 stabilizes a temperature in the fluorescence-containing material injection apparatus 2. Examples of the fluorescence-containing material temperature control section 10 include a peltiert element in which heat is transferred from one side to the other side in response to application of an electric current, and an arrangement in which temperature inside the apparatus is controlled by using a fan. Another example of the fluorescence-containing material temperature control section 10 is arranged such that a temperature sensor (internal temperature sensor) is provided inside the fluorescence-containing material temperature control section 10 so that the temperature inside the apparatus is detected and the temperature inside the apparatus is kept constant. A further example of the fluorescence-containing material temperature control section 10 is such that a temperature sensor (external temperature sensor) provided outside the fluorescence-containing material temperature control section 10 detects the temperature inside the apparatus, and the temperature inside the apparatus is kept constant with reference to the temperature data detected by the external temperature sensor. The temperature is preferably constant at a temperature in the range of 10° C. and 30° C., and more preferably constant at a temperature in the range of 11° C. and 25° C., for example. With this, the viscosity of the fluorescence-containing material M is kept constant and deterioration of the fluorescent material in the fluorescence-containing material M is prevented. However, if the temperature is too low, the fluorescence-containing material M may be contaminated with water inside the apparatus, or bubbles may enter the stirred fluorescence-containing material on account of the increase in the viscosity of the fluorescence-containing material. On this account, the temperature is more preferably constant at a temperature in the range of 19° C. and 21° C.

The fluorescence-containing material stirring section 11 stirs the fluorescence-containing material M in the storage section 16 which is provided in the fluorescence-containing material injection apparatus 2 and stores the fluorescence-containing material M. Examples of the fluorescence-containing material stirring section 11 include propeller-shaped blades with a drive device and a dividing wall with holes in the case of the propeller-shaped blades with a drive device, propeller-shaped blades inside the storage section 16 are rotated by the drive device so that the fluorescence-containing material M is stirred inside the storage section 16. In the case of the dividing wall with holes, the fluorescence-containing material M moves in and out (i.e. winds) through plural holes which are randomly made through a dividing wall which is provided, for example, in a substantially parallel manner in the storage section 16, with the result that the fluorescence-containing material M is stirred in the storage section 16.

The fluorescence-containing material remaining amount sensor 12 detects a remaining amount of the fluorescence-containing material M which is discharged to the outside of the storage section 16 through holes made at a lower part of the storage section 16 and is accumulated between the closed valve 15 and the squeegee 14 (i.e. detects a remaining amount of the fluorescence-containing material M which is prepared in the fluorescence-containing material injection apparatus 2 in order to be supplied to the quantitative template 20). The fluorescence-containing material remaining amount sensor 12 is arranged such that, for example, light is applied to the fluorescence-containing material M and a amount of reflected light from the fluorescence-containing material M is detected by a light-receiving element, so that a remaining amount of the fluorescence-containing material M is detected.

The fluorescence-containing material injection amount adjustment section 13 adjusts an amount of the fluorescence-containing material M to be injected from the fluorescence-containing material injection apparatus 2 to the quantitative template 20, with reference to the remaining amount of the fluorescence-containing material M detected by the fluorescence-containing material remaining amount sensor 12. The fluorescence-containing material injection amount adjustment section 13 determines whether the fluorescence-containing material M is supplied from the storage section 16, by operating the squeegee 14 so as to close or open the holes at the lower part of the storage section 16. Also, the fluorescence-containing material injection amount adjustment section 13 opens or closes the valve 15 so as to adjust an amount of the fluorescence-containing material M supplied from the fluorescence-containing material injection apparatus 2 to the quantitative template 20.

As discussed above, the squeegee 14 closes or opens the holes at the lower part of the storage section 16 so as to allow or disallow the supply of the fluorescence-containing material M, in response to an instruction from the fluorescence-containing material injection amount adjustment section 13. The valve 15 is, as discussed above, opened or closed by the fluorescence-containing material injection amount adjustment section 13 so as to adjust an amount of the fluorescence-containing material M supplied from the fluorescence-containing material injection apparatus 2 to the quantitative template 20. As discussed above, the storage section 16 stores the fluorescence-containing material M which is supplied from the fluorescence-containing material injection apparatus 2 to the quantitative template 20.

The fluorescence-containing material M is resin including a fluorescent material. The fluorescence-containing material M is preferably a fluorescence-containing translucent resin material which is translucent resin containing a fluorescent material. This is because, as the fluorescence-containing material M, a fluorescence-containing translucent resin material including resin with a high optical transparency is preferable. The fluorescence-containing material M preferably includes at least one of the following translucent resins: silicone resin, epoxy resin, acrylic resin, fluoric resin, polyimide resin, and modified silicone epoxy resin. It is therefore possible to use, as the fluorescence-containing material M, silicone resin, epoxy resin, acrylic resin, fluoric resin, polyimide resin, and modified silicone epoxy resin. Silicone resin is particularly preferable in consideration of weather resistance, heat resistance, electric insulation, chemical stability, and significantly high light transmission in the visible region and ultraviolet region.

Figure 3:
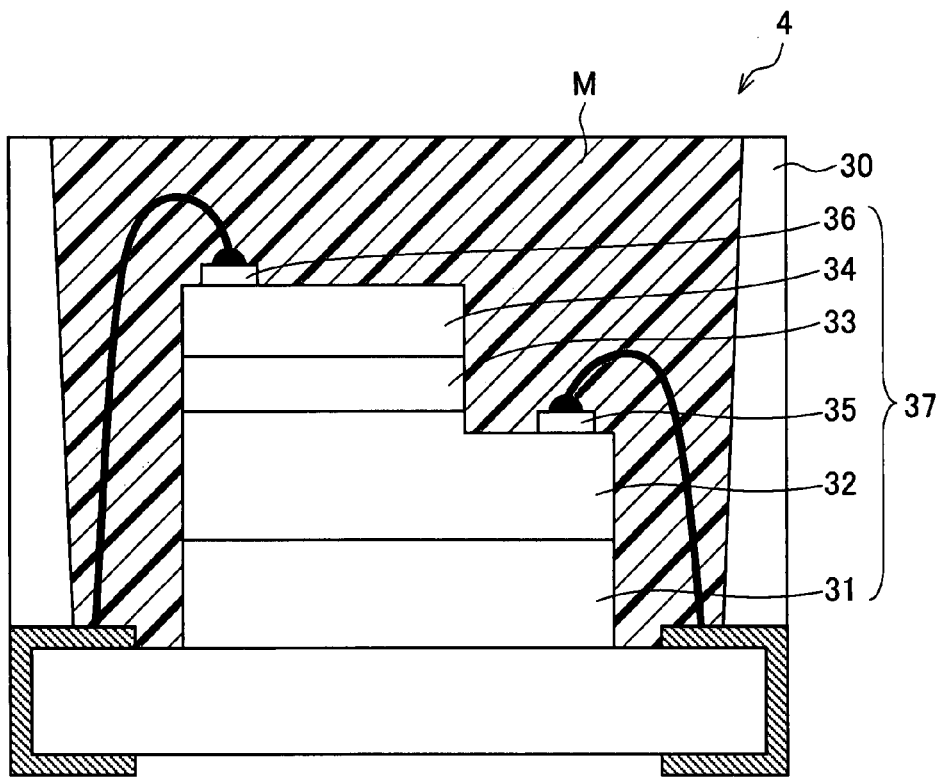
FIG. 3 is a cross section of an embodiment of a semiconductor light emitting apparatus which is manufactured in such a manner that the semiconductor light emitting apparatus manufacturing apparatus forms and shapes a fluorescence-containing material around a semiconductor light emitting element.
Figure 4:
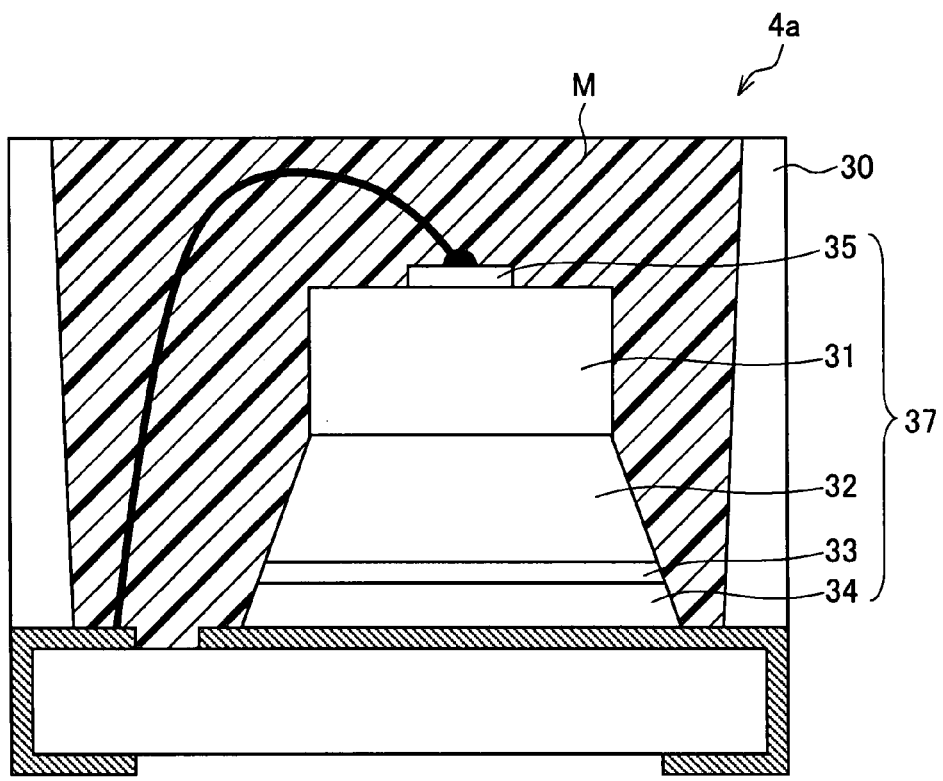
FIG. 4 is a cross section of another embodiment of a semiconductor light emitting apparatus which is manufactured in such a manner that the semiconductor light emitting apparatus manufacturing apparatus forms and shapes a fluorescence-containing material around a semiconductor light emitting element.
Figure 5:
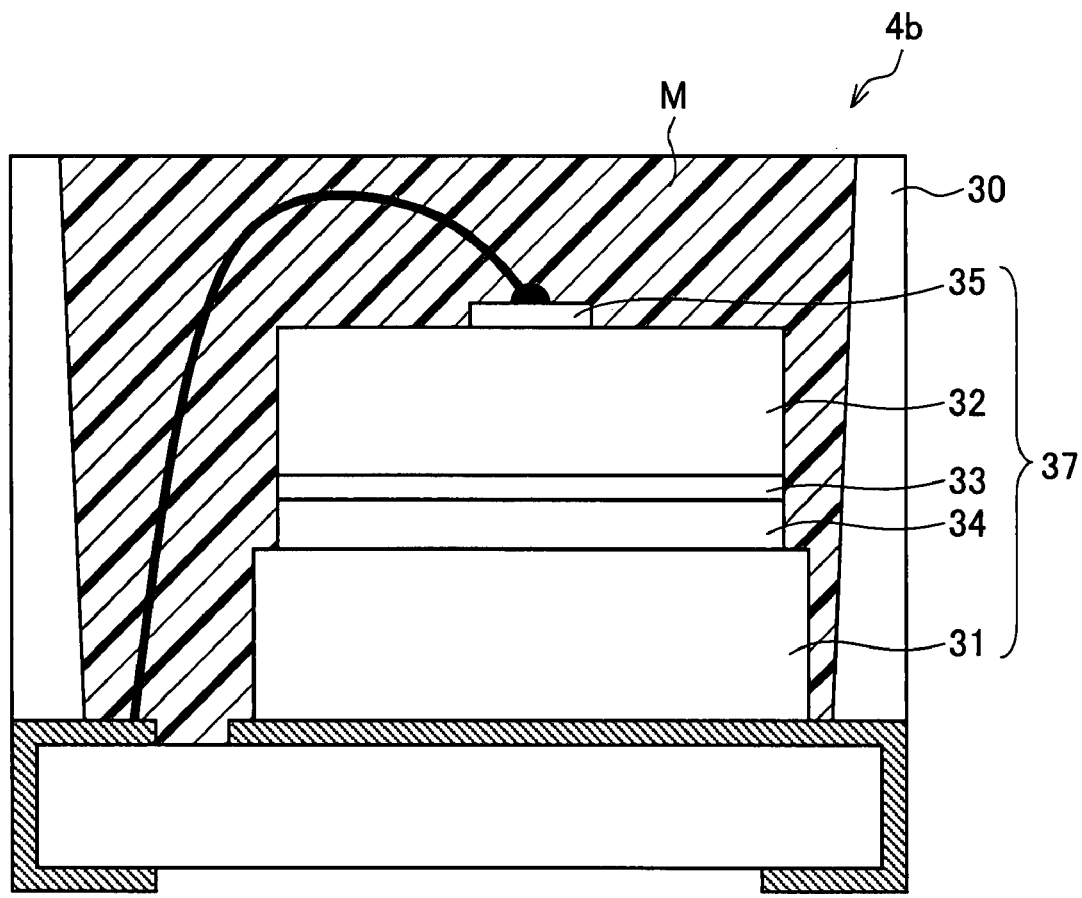
FIG. 5 is a cross section of a further embodiment of a semiconductor light emitting apparatus which is manufactured in such a manner that the semiconductor light emitting apparatus manufacturing apparatus forms and shapes a fluorescence-containing material around a semiconductor light emitting element.

Now, the following will outline the semiconductor light emitting apparatus which is manufactured by forming and shaping a fluorescence-containing material around the semiconductor light emitting element by the semiconductor light emitting apparatus manufacturing apparatus 1, with reference to FIGS. 3-5. FIG. 3 is a cross section of the semiconductor light emitting apparatus 4 which is manufactured by forming and shaping the fluorescence-containing material M around the semiconductor light emitting element 37 by the semiconductor light emitting apparatus manufacturing apparatus 1. As shown in FIG. 3, the semiconductor light emitting apparatus 4 includes a package 30, an element substrate 31, an n-type semiconductor layer 32, a light emitter layer 33, a p-type semiconductor layer 34, an n-side electrode 35, and a p-side electrode 36. The element substrate 31, the n-type semiconductor layer 32, the light emitter layer 33, the p-type semiconductor layer 34, the n-side electrode 35, and the p-side electrode 36 constitute the semiconductor light emitting element 37. The semiconductor light emitting apparatus 4 is formed and shaped in such a manner that, as shown in FIG. 3, the surface of the semiconductor light emitting element 37 including the light emitter layer 33 is covered with the fluorescence-containing material M.

The element substrate 31 has a rectangular shape. Examples of the element substrate 31 include an insulative sapphire substrate and conductive Si, SiC, GaAs, GaP, GaN, and ZnO substrates.

The n-type semiconductor layer 32 is formed by depositing, for example, GaN or AlGaN on the element substrate 31. In the present embodiment, no buffer layer is formed between the n-type semiconductor layer 32 and the element substrate 31. Alternatively, a buffer layer made of GaN or InGaN may be provided between the n-type semiconductor layer 32 and the element substrate 31.

The light emitter layer 33 is an active layer which includes InGaN and provided on the entirety of the surface of the n-type semiconductor layer 32. The light emitter layer 33 emits light on account of recombination of electrons and positive holes. The p-type semiconductor layer 34 is formed by depositing GaN on the entirety of the surface of the light emitter layer 33. The light emitter layer 33 and the p-type semiconductor layer 34 are formed in such a manner that, the light emitter layer 33 including InGaN is deposited on the entirety of the surface of the n-type semiconductor layer 32, the p-type semiconductor layer is formed by depositing GaN on the entirety of the surface of the light emitter layer 33, and then a region where the n-side electrode 35 is to be formed is exposed on the n-type semiconductor layer 32 by dry etching. Although the p-type semiconductor layer 34 is formed by depositing GaN on the surface of the light emitter layer 33 in the present embodiment, the present invention is not limited to this arrangement. For example, a p-type AlGaN semiconductor layer may be deposited between the light emitter layer 33 and the p-type semiconductor layer (p-type GaN semiconductor layer) 34.

The n-side electrode 35 is made of Ti for connection with the n-type semiconductor layer 32 and Au suitable for bonding. The p-side electrode 36 is made of Ni and Au in order to establish ohmic contact with the p-type semiconductor layer 34.

The order of deposition in the semiconductor light emitting element 37 is as follows: the n-type semiconductor layer 32 is deposited on the element substrate 31, the light emitter layer 33 is deposited on the n-type semiconductor layer 32 exclusive of a region where the n-side electrode 35 is to be formed, the p-type semiconductor layer 34 is deposited on the light emitter layer 33, and the p-type electrode 36 is formed on the p-type semiconductor layer 34. The semiconductor light emitting element 37 which is formed in this manner is mounted in the package 30 on which a wiring pattern is formed. In doing so, the n-side electrode 35 is connected to the p-type electrode 36.

The fluorescence-containing material M is formed to cover the semiconductor light emitting element 37 mounted in the package 30 the thickness of the fluorescence-containing material M covering the upper surface of the semiconductor light emitting element 37 and the thickness of the fluorescence-containing material M covering the side faces are appropriately determined in consideration of irregularity in brightness on account of factors such as sedimentation of the fluorescence-containing material M.

A semiconductor light emitting apparatus manufactured by forming and shaping a fluorescence-containing material around the semiconductor light emitting element 37 by the semiconductor light emitting apparatus manufacturing apparatus 1 is not limited to the semiconductor light emitting apparatus 4 shown in FIG. 3. For example, a semiconductor light emitting apparatus 4a and a semiconductor light emitting apparatus 4b shown in FIGS. 4 and 5 can be manufactured by the semiconductor light emitting apparatus manufacturing apparatus 1. FIG. 4 is a cross section of the semiconductor light emitting apparatus 4a which is manufactured by forming and shaping the fluorescence-containing material M around the semiconductor light emitting element 37 by the semiconductor light emitting apparatus manufacturing apparatus 1. FIG. 5 is a cross section of a semiconductor light emitting apparatus 4b which is manufactured by forming and shaping fluorescence-containing material M around the semiconductor light emitting element 37 by the semiconductor light emitting apparatus manufacturing apparatus 1.

First, the semiconductor light emitting apparatus 4a shown in FIG. 4 includes a package 30, an element substrate 31, an n-type semiconductor layer 32, a light emitter layer 33, a p-type substrate layer 34, an n-side electrode 35, and a p-type electrode 36 (not illustrated). Comparing the semiconductor light emitting apparatus 4a with the semiconductor light emitting apparatus 4, the order of deposition of the semiconductor light emitting element 37 is different. More specifically, in the semiconductor light emitting apparatus 4a, the p-type semiconductor layer 34, the light emitter layer 33, the n-type semiconductor layer 32, and the element substrate 31 are deposited in this order in the package 30. In other words, in the semiconductor light emitting element 37 of the semiconductor light emitting apparatus 4a, the element substrate 31, the n-type semiconductor layer 32, the light emitter layer 33, and the p-type semiconductor layer 34 are deposited from above.

Being similar to the semiconductor light emitting apparatus 4a, the semiconductor light emitting apparatus 4b shown in FIG. 5 includes a package 30, an element substrate 31, an n-type semiconductor layer 32, a light emitter layer 33, a p-type semiconductor layer 34, an n-side electrode 35, a p-side electrode 36 (not illustrated), and an electrode on the back side of the element substrate 31. Comparing the semiconductor light emitting apparatus 4b with the semiconductor light emitting apparatus 4, the order of deposition of the semiconductor light emitting element 37 is different. The order of deposition of the semiconductor light emitting element 37 is also different between the semiconductor light emitting apparatus 4a and the semiconductor light emitting apparatus 4b. More specifically, in the semiconductor light emitting apparatus 4b, the element substrate 31, the p-type semiconductor layer 34, the light emitter layer 33, and the n-type semiconductor layer 32 are deposited in this order in the package 30. In other words, in the semiconductor light emitting element 37 of the semiconductor light emitting apparatus 4a, the n-type semiconductor layer 32, the light emitter layer 33, the p-type semiconductor layer 34, and the element substrate 31 are deposited from above. The element substrate 31 in the semiconductor light emitting apparatus 4b shown in FIG. 5 may be made of Cu, Cu—W (tungsten), or Cu—Mo (molybdenum).

Figure 6:
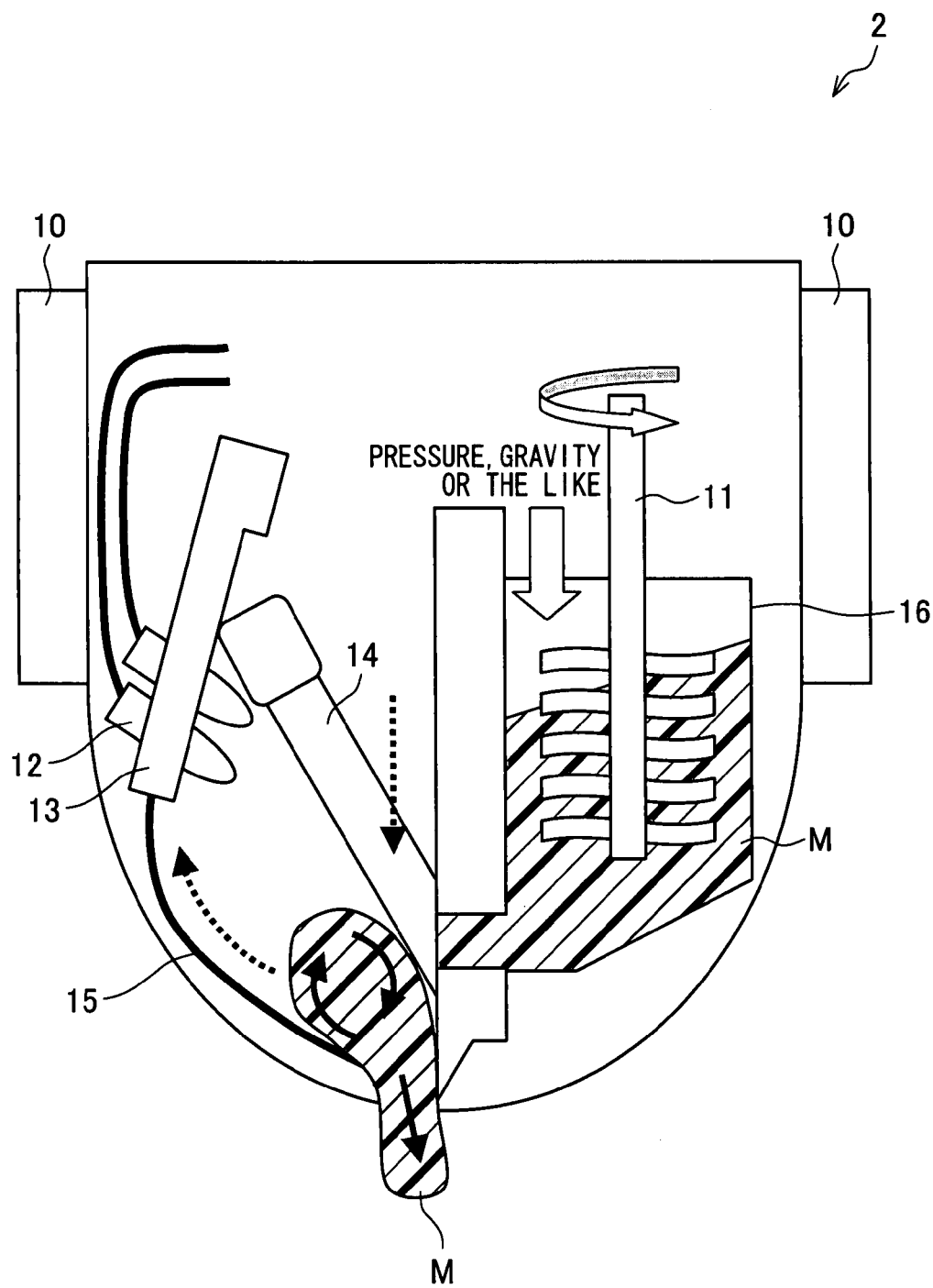
FIG. 6 shows a method of manufacturing a semiconductor light emitting apparatus of the present invention.
Figure 7:
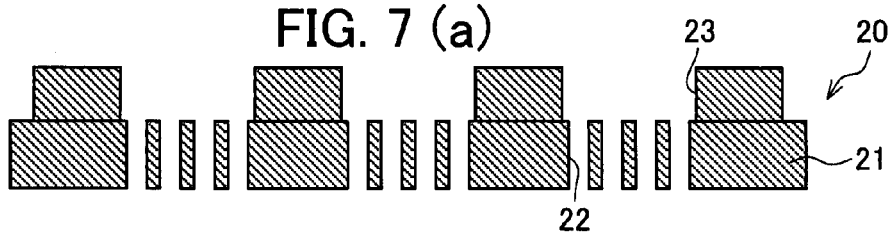
FIGS. 7(a)-7(f) relate to a method of manufacturing a semiconductor light emitting apparatus of the present invention.
Figure 7:
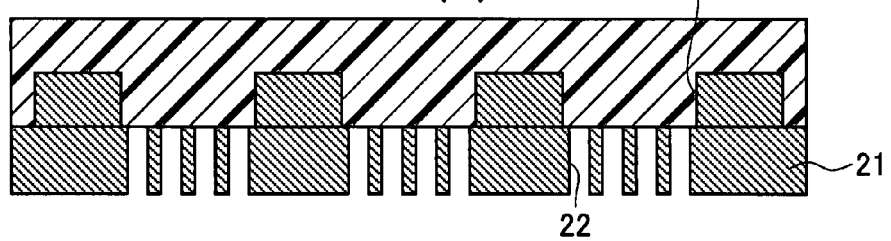
Figure 7:
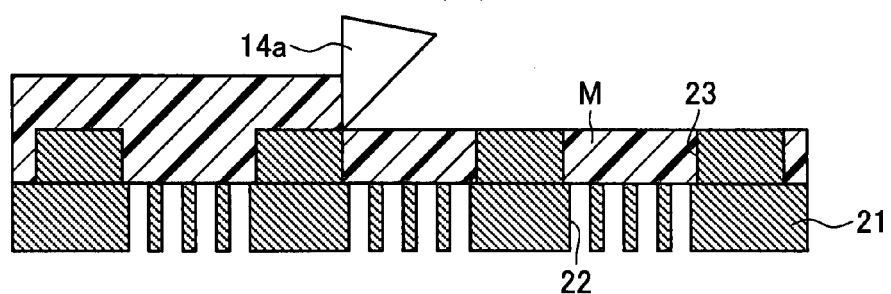
Figure 7:
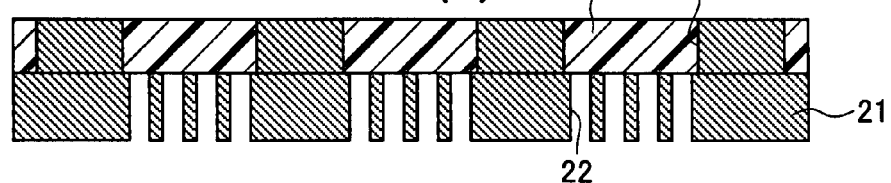
Figure 7:
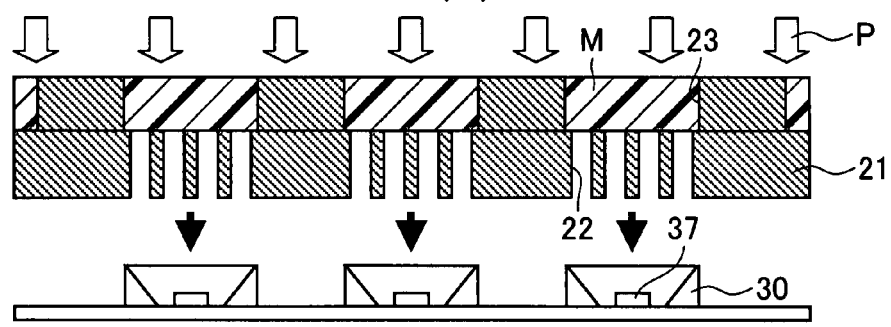
Figure 7:
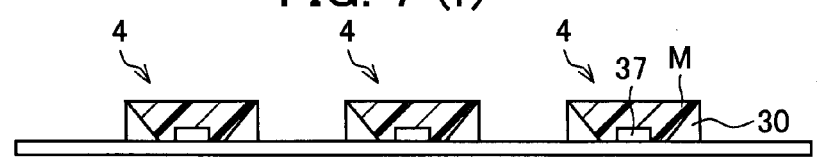
Figure 8:
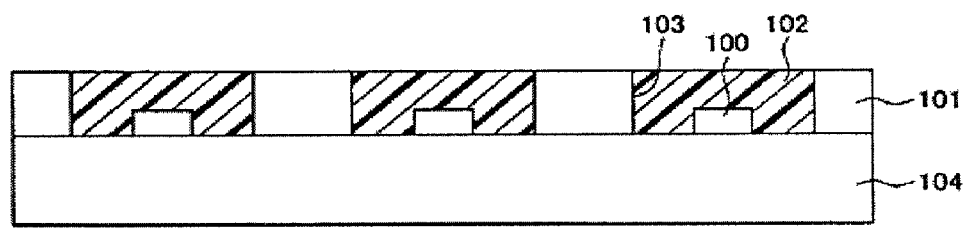
FIG. 8 is a cross section showing a semiconductor light emitting apparatus which is manufactured by a conventional method of manufacturing a semiconductor light emitting apparatus.

Now, referring to FIGS. 6 to 7(f), the following will discuss a method of manufacturing a semiconductor light emitting apparatus 4 by forming and shaping the fluorescence-containing material M around the semiconductor light emitting element 37 by the semiconductor light emitting apparatus manufacturing apparatus 1. FIG. 6 shows how the fluorescence-containing material M which is applied to the semiconductor light emitting apparatus 4 is injected to a quantitative template by the fluorescence-containing material injection apparatus 2 of the present invention. FIG. 7(a) shows a quantitative template 20 used for applying the fluorescence-containing material M around the semiconductor light emitting element 37. FIG. 7(b) shows a state where the fluorescence-containing material M is injected into openings 23 of the quantitative template 20. FIG. 7(c) shows a step of removing excessively deposited fluorescence-containing material M from the quantitative template 20 by using the squeegee 14a. FIG. 7(d) shows a state where the excessively deposited fluorescence-containing material M has been removed from the quantitative template 20 by using the squeegee 14a. FIG. 7(e) shows a step of applying the fluorescence-containing material M onto the semiconductor light emitting element 37 through openings 22 of a mesh mask of the quantitative template 20. FIG. 7(f) shows the semiconductor light emitting apparatus 4 in which the fluorescence-containing material M has been formed and shaped.

First, referring to FIG. 6, the following will discuss steps until the fluorescence-containing material M which is to be applied to the semiconductor light emitting apparatus 4 is injected into the quantitative template 20 by the fluorescence-containing material injection apparatus 2.

In the present invention, the inside of the fluorescence-containing material injection apparatus 2 is kept at a constant temperature by the fluorescence-containing material temperature control section 10 (temperature control step). The fluorescence-containing material M stored in the storage section 16 in the fluorescence-containing material injection apparatus 2 is stirred by the fluorescence-containing material stirring section 11 (stirring step). Subsequently, the fluorescence-containing material M stored in the storage section 16 gravitates to the outside of the storage section 16 through the holes at a lower part of the storage section 16. In case where the aforesaid closed space in which the fluorescence-containing material injection apparatus 2, the pressure device 3, and the quantitative template 20 are provided is filled with an inactive gas such as nitrogen and argon, the fluorescence-containing material M stored in the storage section 16 is pushed by a gas pressure to the outside of the storage section 16 through the holes at the lower part of the storage section 16. At this time, in response to an instruction of the fluorescence-containing material injection amount adjustment section 13, the squeegee 14 which has closed the holes at the lower part of the storage section 16 moves away from the holes so that the fluorescence-containing material M is allowed to get out to the outside of the storage section 16. Thereafter, in accordance with a remaining amount of the fluorescence-containing material M detected by the fluorescence-containing material remaining amount sensor 12 (remaining amount detecting step), the fluorescence-containing material injection amount adjustment section 13 opens or closes the valve 15 so that an amount of the fluorescence-containing material M supplied from the fluorescence-containing material injection apparatus 2 is adjusted, and the fluorescence-containing material M is injected into the quantitative template 20 (material injection amount adjusting step).

The aforesaid gas pressure is preferably higher than atmosphere pressure by 1.0 kPa to 4.0 kPa.

In the present embodiment, the fluorescence-containing material injection amount adjustment section 13 opens or closes the valve 15 with reference to a remaining amount of the fluorescence-containing material M detected by the fluorescence-containing material remaining amount sensor 12, so that an amount of the fluorescence-containing material M supplied from the fluorescence-containing material injection apparatus 2 is adjusted. The present invention, however, is not limited to this arrangement. For example, the following arrangement may be adopted: the fluorescence-containing material injection amount adjustment section 13 operates the squeegee 14 with reference to a remaining amount of the fluorescence-containing material M detected by the fluorescence-containing material remaining amount sensor 12 and adjust an amount of the fluorescence-containing material M supplied to the outside of the storage section 16, so that an amount of the fluorescence-containing material M supplied from the fluorescence-containing material injection apparatus 2 is adjusted. Alternatively, the following arrangement may be adopted: the fluorescence-containing material injection amount adjustment section 13 controls both the valve 15 and the squeegee 14 so that an amount of the fluorescence-containing material M supplied from the fluorescence-containing material injection apparatus 2 is adjusted.

Referring to FIGS. 7(a)-7(f), the following will describe steps until the fluorescence-containing material M injected into the quantitative template 20 is applied onto and shaped around the semiconductor light emitting element 37.

First, as shown in FIG. 7(a), the quantitative template 20 is prepared so that the openings 23 of the quantitative template are aligned with meshed parts (openings 22) of the mesh mask 21. In the present embodiment, the quantitative template 20 and the mesh mask 21 are made of stainless steel. The width of each opening 22 of the mesh mask is 20 μm, the diameter of each opening 23 of the quantitative template 20 is ϕ2 mm, and the interval between the neighboring openings 23 of the quantitative template 20 is 5.2 mm. The quantitative template 20 and the mesh mask 21 may be made of metal other than stainless steel, such as nickel. With these arrangements, the quantitative template 20 and the mesh mask 21 hardly corrode or get scratched by the injection of the fluorescence-containing material M into the openings 23 of the quantitative template 20.

The depth of each opening 23 preferably falls in the range of 0.2 mm to 1.0 mm.

Preferably, each opening 23 has a circular planer shape and the diameter thereof falls within the range of 0.2 mm to 10 mm.

As discussed with reference to FIG. 6, the fluorescence-containing material M is injected into the openings 23 of the quantitative template 20 by using the fluorescence-containing material injection apparatus 2, so that the quantitative template 20 in which the openings 23 are filled with the fluorescence-containing material M is obtained as shown in FIG. 7(b). The fluorescence-containing material M used in this case is a BOS fluorescent material in this embodiment.

Subsequently, as shown in FIG. 7(c), excessively deposited fluorescence-containing material M is removed by using the squeegee 14a. In the present embodiment, as shown in FIG. 7(d), the fluorescence-containing material M is removed to the extent that the upper surface of the quantitative template 20 is exposed.

Also, as shown in FIG. 7(e), the openings 23 of the quantitative template 20, to which the fluorescence-containing material M has been injected, are aligned with respective openings of the package 30 in which the semiconductor light emitting element 37 is mounted. Thereafter, by means of gas pressure P, the fluorescence-containing material M injected to the openings 23 of the quantitative template is applied, through the openings 22 of the mesh mask, into the package 30 in which the semiconductor light emitting element 37 is mounted. In the present embodiment, pressure (gas pressure P) is applied by decreasing the internal pressure of the semiconductor light emitting apparatus manufacturing apparatus 1 in such a manner that air is injected into an airbag which is a pressure device 3 so that the air bag is inflated. In the present embodiment, the gas pressure P is 2.5 kPa. Alternative to the airbag, the pressure device 3 may be arranged such that, for example, a compressed air is supplied from the outside of the semiconductor light emitting apparatus manufacturing apparatus 1 to the inside thereof so that gas pressure is adjusted.

Lastly, since the fluorescence-containing material M contains a thermosetting adhesive, the fluorescence-containing material M is hardened in a thermosetting furnace, so that the semiconductor light emitting apparatus 4 is manufactured by forming and shaping the fluorescence-containing material M around the semiconductor light emitting element 37 in the package 30 as shown in FIG. 7(f).

In the present invention, a fluorescence-containing material injection apparatus 2 includes: a fluorescence-containing material temperature control section 10 which restrains disproportion in the mixture ratio of contaminants in the fluorescence-containing material M; a fluorescence-containing material stirring section 11, a fluorescence-containing material remaining amount sensor 12, and a fluorescence-containing material injection amount adjustment section 13.

The present invention may include the steps of: providing a semiconductor light emitting element 37 in a package 30; providing a quantitative template (shaping template) 20 in the package 30, in the quantitative template 20 openings 22 of a mesh mask being positioned above the semiconductor light emitting element 37; restraining disproportion in the mixture ratio of the contaminants in the fluorescence-containing material M which is injected from the fluorescence-containing material injection apparatus 2 to the quantitative template 20 by the fluorescence-containing material temperature control section 10, the fluorescence-containing material stirring section 11, the fluorescence-containing material remaining amount sensor 12, and the fluorescence-containing material injection amount adjustment section 13 (equalization sections) of the fluorescence-containing material injection apparatus 2 (equalization step); injecting the fluorescence-containing material M into the openings 22 of the mesh mask by the fluorescence-containing material injection apparatus 2; applying gas pressure P to the fluorescence-containing material M; removing unnecessary fluorescence-containing material; and shaping the fluorescence-containing material M by hardening the fluorescence-containing material M.

Since the fluorescence-containing material temperature control section 10, the fluorescence-containing material stirring section 11, the fluorescence-containing material remaining amount sensor 12, and the fluorescence-containing material injection amount adjustment section 13 (equalization sections) which restrain disproportion in the mixture ratio of the contaminants in the fluorescence-containing material M are provided, it is possible to keep the mixture ratio of the contaminants in the fluorescence-containing material M to be constant. On this account, it is possible to inject the fluorescence-containing material M having a constant mixture ratio into the quantitative template 20 for screen printing, which is used for the screen-printing semiconductor light emitting apparatus manufacturing apparatus 1 which applies the fluorescence-containing material M to the semiconductor light emitting element 37 in the package 30 of the semiconductor light emitting apparatus 4. The fluorescence-containing material M can therefore be evenly applied to the semiconductor light emitting element 37. As a result, it is possible to restrain the decrease in chromaticity yield and to provide a semiconductor light emitting apparatus which can emit uniform light and is almost free from color irregularity. The mixture ratio of the contaminants is, for example, the weight ratio between the fluorescent material and resin.

The fluorescence-containing material injection apparatus 2 of the present invention further includes: a fluorescence-containing material remaining amount sensor 12 which detects a remaining amount of the fluorescence-containing material M which is supplied to the outside of the storage section 16 of the fluorescence-containing material injection apparatus 2 and is injected from the fluorescence-containing material injection apparatus 2 to the quantitative template 20; and a fluorescence-containing material injection amount adjustment section 13 which adjusts an amount of the fluorescence-containing material M supplied to the quantitative template 20 in accordance with the remaining amount detected by the fluorescence-containing material remaining amount sensor 12.

As a result of this, in accordance with the remaining amount of the fluorescence-containing material detected by the fluorescence-containing material remaining amount sensor 12, an amount of the fluorescence-containing material M supplied to the quantitative template 20 is adjusted by the fluorescence-containing material injection amount adjustment section 13 so that the mixture ratio between the fluorescent material and translucent resin is kept constant. It is therefore possible to apply the fluorescence-containing material M without changing the mixture ratio between the fluorescent material and resin from start to finish.

The fluorescent material included in the fluorescence-containing material M is not particularly limited to a specific type. Preferably, at least one of the following fluorescent materials is included: YAG (yttrium aluminum garnet) fluorescent material to which gadolinium and cerium are added; BOS (barium ortho-silicate) fluorescent material, and TAG (terbium aluminum garnet) fluorescent material. As the semiconductor light emitting element 37 is used with these fluorescent materials, it is possible to use at least one of semiconductor light emitting element emitting ultraviolet light, red light, blue light, yellow light, and green light.

With this, it is possible to adopt a fluorescent material typically used for light emitting devices, as the fluorescent material included in the fluorescence-containing material. An example of such a fluorescent material is a combination of a blue light emitting element and a YAG fluorescent material. In case where two or more different types of fluorescent materials are used in combination, the second fluorescent material may not only absorb light from the semiconductor light emitting element 37 and emit wavelength light but also absorb fluorescent light emitted from the first luminescent material and emit wavelength light. The fluorescent material may include a light diffusion member. This makes it possible to reduce irregularity in emitted light.

The material of the mesh mask 21 is stainless in the present embodiment, but the material is not limited to this. For example, the mesh mask 21 may be made of metal such as nickel, or the material of the mesh mask 21 may be at least one of synthetic fiber made of polyamide synthetic polymer (i.e. nylon) and polyester synthetic fiber (i.e. tetron).

The quantitative template 20 may be combined with the mesh mask 21, or the quantitative template 20 and the mesh mask 21 may be different members. Also, the quantitative template 20 and the mesh mask 21 may be made of different materials.

In the present embodiment, the planar shape of each opening 23 of the quantitative template 20 which determines the quantity of the fluorescence-containing material is circular. However, the shape of each opening 23 of the quantitative template 20 may be determined in accordance with the shape of the package 30. For example the planer shape of each opening 23 of the quantitative template may be rectangular, polygonal, or irregular.

In the present embodiment, the shape of each opening 22 of the mesh mask is rectangular. However, the shape of each opening 22 may be circular, polygonal, or irregular.

In the present embodiment, the width of each opening 22 of the mesh mask is 20 μm, the diameter of each opening 23 of the quantitative template is $\phi 2$ mm, the interval between the neighboring openings 23 of the quantitative template is 5.2 mm, and the gas pressure P is 2.5 kPa. These numbers, however, may be appropriately determined.

In the present embodiment, a method of manufacturing the semiconductor light emitting apparatus 4 has been described with reference to FIGS. 6-7(f). Alternatively, semiconductor light emitting apparatus 4a and the semiconductor light emitting apparatus 4b may be manufactured by the method described with reference to FIGS. 6-7(f).

In the present embodiment, the fluorescence-containing material injection apparatus 2 includes the fluorescence-containing material temperature control section 10, the fluorescence-containing material stirring section 11, the fluorescence-containing material remaining amount sensor 12, and the fluorescence-containing material injection amount adjustment section 13. However, the fluorescence-containing material injection apparatus 2 may not be required to include all of these members. For example, the fluorescence-containing material injection apparatus 2 may not include the fluorescence-containing material stirring section 11, the fluorescence-containing material remaining amount sensor 12, and the fluorescence-containing material injection amount adjustment section 13. Also in this case, a temperature of the fluorescence-containing material M in the fluorescence-containing material injection apparatus 2 is kept constant, and hence the mixture ratio of the fluorescence-containing material M is kept constant. Also, for example, the fluorescence-containing material injection apparatus 2 may not include the fluorescence-containing material temperature control section 10, the fluorescence-containing material remaining amount sensor 12, and the fluorescence-containing material injection amount adjustment section 13. Also in this case, the mixture ratio of the fluorescence-containing material M is kept constant because the fluorescence-containing material M in the fluorescence-containing material injection apparatus 2 is stirred. Furthermore, for example, the fluorescence-containing material injection apparatus 2 may not include the fluorescence-containing material temperature control section 10 and the fluorescence-containing material stirring section 11. In this case, the fluorescence-containing material remaining amount sensor 12 and the fluorescence-containing material injection amount adjustment section 13 keep the mixture ratio of the fluorescence-containing material M to be constant.

In addition to the fluorescence-containing material temperature control section 10 in the fluorescence-containing material injection apparatus 2, a fluorescence-containing material temperature control section 10 may be additionally provided in the semiconductor light emitting apparatus manufacturing apparatus 1 in order to adjust a temperature in the semiconductor light emitting apparatus manufacturing apparatus 1. With this, in case where a semiconductor light emitting apparatus is manufactured by screen printing using a stencil, change in the viscosity of the fluorescence-containing material M on account of temperature change in the semiconductor light emitting apparatus manufacturing apparatus 1 is restrained when the fluorescence-containing material M is injected into the quantitative template 20 and the stencil is removed. It is therefore possible to prevent a disadvantage such that the fluorescence-containing material M is adhered to the wall of the stencil on the opening side thereby causing the fluorescent layer to be deformed, on account of increase in the adhesion of the fluorescence-containing material M. This makes it possible to acquire a semiconductor light emitting apparatus having desired thickness and shape, and hence irregularities in colors and light emission are restrained in the semiconductor light emitting apparatus including the above-described fluorescent layer.

The semiconductor light emitting element 37 of the present invention may be a semiconductor light emitting element which emits light in the near ultraviolet region to the infrared region.

The bottom surface of the mesh mask (mesh section) 21 is preferably distanced from the uppermost part of the package (peripheral wall) 30 for 0.05 to 0.25 mm.

The width of each opening (hole) of the mesh mask preferably falls within the range of 10 to 100 μm.

According to the present invention, since equalization sections for restraining disproportion in the mixture ratio of the contaminants in the fluorescence-containing material are included, it is possible to keep the mixture ratio of the contaminants in the fluorescence-containing material to be constant. Therefore, it is possible to evenly apply the fluorescence-containing material to the semiconductor light emitting element.

An injection apparatus of the present invention, which is used for a manufacturing apparatus which applies, by screen printing, a fluorescence-containing material including a fluorescent material and resin onto a semiconductor light emitting element in a package of a semiconductor light emitting apparatus, the injection apparatus injecting the fluorescence-containing material into a shaping template for the screen printing, includes at least one equalization section which restrains disproportion in a mixture ratio of contaminants in the fluorescence-containing material.

The injection apparatus of the present invention is preferably arranged such that said at least one equalization section is a temperature control section which adjusts a temperature in the injection apparatus to be at a predetermined temperature.

With this, since the temperature control section keeps the temperature in the injection apparatus at a predetermined temperature, the temperature in the injection apparatus is kept constant. As a result, the temperature inside the injection apparatus does not greatly vary and hence the viscosity of the fluorescence-containing material does not greatly change in accordance with change in ambient temperature. Therefore, a sedimentation condition of sediment in the fluorescence-containing material hardly varies (i.e. a fluorescent material with a high gravity hardly settles down, and hence unevenness in the density of the fluorescence-containing material is eliminated. As a result, since the disproportion in the mixture ratio of the fluorescence-containing material is restrained, it is possible to evenly apply the fluorescence-containing material onto the semiconductor light emitting element. Furthermore, since the temperature control section can keep, for example, the temperature inside the injection apparatus at a low temperature, it is possible to prevent deterioration of a fluorescent material in the fluorescence-containing material.

The injection apparatus of the present invention is preferably arranged such that the temperature control section keeps the temperature in the injection apparatus at a temperature not lower than 10° C. and not higher than 30° C.

According to this arrangement, by the temperature control section, the temperature inside the injection apparatus is kept so as to fall within a temperature range of not lower than 10° C. and not higher than 30° C. at which the fluorescent material hardly deteriorates. It is therefore possible to prevent deterioration of the fluorescent material in the fluorescence-containing material.

The injection apparatus of the present invention is preferably arranged such that said at least one equalization section is a stirring section which stirs the fluorescence-containing material in the injection apparatus.

According to this arrangement, the stirring section stirs the fluorescence-containing material in the injection apparatus. On this account, the stirring prevents the disproportion in the mixture ratio of the fluorescence-containing material, which occurs because of sedimentation of the fluorescent material having a higher specific gravity than the resin material. It is therefore possible to evenly apply the fluorescence-containing material onto the semiconductor light emitting element.

The injection apparatus of the present invention is preferably arranged such that the stirring section is either propeller-shaped blades with a drive device or a dividing wall with a hole.

According to this arrangement, the propeller-shaped blades with a drive device are rotated by the drive device so that the fluorescence-containing material in the injection apparatus is stirred. In the case of the dividing wall with holes, the fluorescence-containing material moves in and out (i.e. winds) through plural holes made through the dividing wall, with the result that the fluorescence-containing material is stirred in the injection apparatus.

The injection apparatus of the present invention is preferably arranged such that said at least one equalization section are: a remaining amount detection section which detects a remaining amount of the fluorescence-containing material; and a material injection amount adjustment section which adjusts an amount of the fluorescence-containing material supplied to the shaping template, in accordance with the remaining amount detected by the remaining amount detection section.

According to this arrangement, in accordance with the remaining amount of the fluorescence-containing material detected by the remaining amount detection section, the material injection amount adjustment section adjusts an amount of the fluorescence-containing material supplied to the shaping plate. It is therefore possible to apply the fluorescence-containing material without changing its mixture ratio from start to finish.

The injection apparatus of the present invention is preferably arranged such that the injection apparatus is filled with an inactive gas.

This arrangement makes it possible to use gas pressure caused by the inclusion of inactive gas inside the injection apparatus, for supplying the fluorescence-containing material from the inside of the injection apparatus to the outside thereof.

The injection apparatus of the present invention is preferably arranged such that the fluorescence-containing material includes at least one translucent resin selected from silicone resin, epoxy resin, acrylic resin, fluoric resin, polyimide resin, and modified silicone epoxy resin.

This makes it possible to use, as the fluorescence-containing material, silicone resin, epoxy resin, acrylic resin, fluoric resin, polyimide resin, and/or modified silicone epoxy resin. Since silicone resin has a high viscosity, the sedimentation of the fluorescent material in the fluorescence-containing material is further restrained. This makes it possible to further restrain the disproportion in the mixture ratio of the fluorescence-containing material.

The injection apparatus of the present invention is preferably arranged such that the fluorescence-containing material includes at least one fluorescent material selected from: YAG (yttrium aluminum garnet) fluorescent material to which gadolinium and cerium are added; BOS (barium ortho-silicate) fluorescent material, and TAG (terbium aluminum garnet) fluorescent material.

With this, it is possible to adopt a fluorescent material typically used for light emitting devices, as the fluorescent material included in the fluorescence-containing material. An example of such a fluorescent material is a combination of a blue light emitting element and a YAG fluorescent material.

Examples of inorganic fluorescent materials are as follows: fluorescent materials emitting red light such as $6MgO.As_2O_5$:$Mn^{4+}$, $Y(PV)O_4$:Eu, $CaLa_{0.1}Eu_{0.9}Ga_3O_7$, $BaY_{0.9}Sm_{0.1}Ga_3O_7$, $Ca(Y_{0.5}Eu_{0.5})(Ga_{0.5}In_{0.5})_3O_7$, $Y_3O_3$:Eu, $YVO_4$:Eu, $Y_2O_2$:Eu, $3.5MgO.0.5MgF_2GeO_2$:$Mn^{4+}$, and $(Y.Cd)BO_2$:Eu; fluorescent materials emitting blue light such as $(Ba,Ca,Mg)_5(PO_4)_3Cl$:$Eu^{2+}$, $(Ba,Mg)_2Al_2O_{27}$:$Eu^{2+}$, $Ba_3MgSi_2O_8$:$Eu^{2+}$, $BaMg_2Al_2O_{27}$:$Eu^{2+}$, $(Sr,Ca)_{10}(PO_4)_6Cl_2$:$Eu^{2+}$, $(Sr,Ca)_{10}(PO_4)_6Cl_2.nB_2O_3$:$Eu^{2+}$, $Sr_{10}(PO_4)_6Cl_2$:$Eu^{2+}$, $(Sr,Ba,Ca)_5(PO_4)_3Cl$:$Eu^{2+}$, $Sr_2P_2O_7$:Eu, $Sr_5(PO_4)_3Cl$:Eu, $(Sr,Ca,Ba)_3(PO_4)_6Cl$:Eu, $SrO.P_2O_5.B_2O_5$:Eu, $(Ba,Ca)_5(PO_4)_3Cl$:Eu, $SrLa_{0.95}Tm_{0.05}Ga_3O_7$, ZnS:Ag, $GaWO_4$, $Y_2SiO_6$:Ce, ZnS:Ag,Ga,Cl, $Ca_2B_4OCl$:$Eu^{2+}$, $BaMgAl_4O_3$:$Eu^{2+}$, and a fluorescent material expressed by a general formula $(M1,Eu)_{10}(PO_4)_6Cl_2$ (M1 is at least one element selected from a group of Mg, Ca, Sr, and Ba); fluorescent materials emitting green light such as $Y_3Al_5O_{12}$:$Ce^{3+}$+(YAG), $Y_2SiO_5$:$Ce^{3+}$, $Tb^{3+}$, $Sr_2Si_3O_8.2SrCl_2$:Eu, $BaMg_2Al_2O_{27}$:$Eu^{2+}$, $Mn^{2+}$, $ZnSiO_4$:Mn, $Zn_2SiO_4$:Mn, $LaPO_4$:Tb, $SrAl_2O_4$:Eu, $SrLa_{0.2}Tb_{0.8}Ga_3O_7$, $CaY_{0.9}Pr_{0.1}Ga_3O_7$, $ZnGd_{0.8}Ho_{0.2}Ga_3O_7$, $SrLa_{0.6}Tb_{0.4}Al_3O_7$, ZnS:Cu,Al, (Zn,Cd)S:Cu,Al, ZnS:Cu,Au,Al, $Zn_2SiO_4$:Mn, $ZnSiO_4$:Mn, ZnS:Ag,Cu, (Zn.Cd)S:Cu, ZnS:Cu, GdOS:Tb, LaOS:Tb, $YSiO_4$:Ce.Tb, $ZnGeO_4$:Mn, GeMgAlO:Tb, SrGaS:$Eu^{2+}$, ZnS:Cu.Co, $MgO.nB_2O_3$:Ge,Tb, LaOBr:Tb,Tm, and $La_2O_2S$:Tb; fluorescent materials emitting white light such as $YVO_4$:Dy; and fluorescent materials emitting yellow light such as $CaLu_{0.5}Dy_{0.5}Ga_3O_7$. Also, in case where light emitted from the light emitting element is near ultraviolet light having the wavelength of not higher than 420 nm, one of or a combination of at least two of the following fluorescent materials: ZnS:Cu,Al, (Zn,Cd)S:Cu,Al, ZnS:Cu,Au,Al, $Y_2SiO_5$:Tb, (Zn,Cd)S:Cu, $Gd_2O_2S$:Tb, $Y_2O_2S$:Tb, $Y_3Al_5O_{12}$:Ce, (Zn,Cd)S:Ag, ZnS:Ag,Cu,Ga,Cl, $Y_3Al_5O_{12}$:Tb, $Y_3(Al,Ga)_5O_{12}$:Tb, $Zn_2SiO_4$:Mn, $LaPO_4$:Ce,Tb, $Y_2O_3S$:Eu, $YVO_4$:Eu, ZnS:Mn, $Y_2O_3$:Eu, ZnS:Ag, ZnS:Ag,Al, $(Sr,Ca,Ba,Mg)_{10}(PO_4)_6Cl_2$:Eu, $Sr_{10}(PO_4)_6Cl_2$:Eu, (Ba,Sr,Eu)(Mg,Mn)$Al_{10}O_{17}$, (Ba,Eu)MgAl$_{10}O_{17}$, ZnO:Zn, and $Y_2SiO_5$:Ce.

A manufacturing apparatus of the present invention, which applies, by screen printing, a fluorescence-containing material which is resin including a fluorescent material onto a semiconductor light emitting element in a package of a semiconductor light emitting apparatus, includes: a shaping template for the screen printing; and one of the foregoing injection apparatuses.

The manufacturing apparatus of the present invention preferably further includes at least one pressure adjustment device which changes gas pressure in the manufacturing apparatus, and the shaping template, the injection apparatus, and the pressure adjustment device are preferably provided in a single closed space.

According to this arrangement, pressure inside the manufacturing apparatus can be adjusted by the pressure adjustment device. On this account, it is possible to push out the fluorescence-containing material from the shaping template by applying pressure to the fluorescence-containing material filling the shaping template in the manufacturing apparatus, so as to apply the fluorescence-containing material onto the semiconductor light emitting element.

The manufacturing apparatus of the present invention is preferably arranged such that the pressure adjustment device is an airbag which inflates so as to increase the gas pressure in the manufacturing apparatus and deflates so as to decrease the gas pressure in the manufacturing apparatus.

According to this arrangement, pressure inside the manufacturing apparatus can be increased by inflating the airbag, whereas pressure inside the manufacturing apparatus can be decreased by deflating the airbag. On this account, it is possible to push out the fluorescence-containing material from the shaping template by applying pressure to the fluorescence-containing material filling the shaping template in the manufacturing apparatus, so as to apply the fluorescence-containing material to the semiconductor light emitting element.

A method of manufacturing a semiconductor light emitting apparatus of the present invention, which applies a fluorescence-containing material including a fluorescent material and resin onto a semiconductor light emitting element in a package of a semiconductor light emitting apparatus, includes the step of: (i) restraining, by an equalization section, disproportion in a mixture ratio of contaminants in the fluorescence-containing material which is injected by an injection apparatus to a shaping template for screen printing, the equalization section being included in the injection apparatus.

The manufacturing method of the present invention is preferably arranged such that the step (i) includes the sub-step of adjusting a temperature in the injection apparatus to be at a predetermined temperature.

According to this arrangement, since the temperature control section adjusts the temperature in the injection apparatus to be at a predetermined temperature, the temperature in the injection apparatus is kept constant. As a result, the temperature inside the injection apparatus does not greatly vary and hence the viscosity of the fluorescence-containing material does not greatly change in accordance with change in ambient temperature. Therefore, a sedimentation condition of sediment in the fluorescence-containing material hardly varies (i.e. a fluorescent material with a high gravity hardly settles down, and hence unevenness in the density of the fluorescence-containing material is eliminated. As a result, since the disproportion in the mixture ratio of the fluorescence-containing material is restrained, it is possible to evenly apply the fluorescence-containing material onto the semiconductor light emitting element. Furthermore, since the temperature control section can keep, for example, the temperature inside the injection apparatus at a low temperature, it is possible to prevent deterioration of a fluorescent material in the fluorescence-containing material.

The manufacturing method of the present invention is preferably arranged such that the step (i) includes the sub-step of stirring the fluorescence-containing material in the injection apparatus.

According to this arrangement, since the fluorescence-containing material in the injection apparatus is stirred by the stirring section, the disproportion in the mixture ratio of the fluorescence-containing material on account of sedimentation of the fluorescent material having a higher specific gravity than the resin material is restrained by the stirring. It is therefore possible to evenly apply the fluorescence-containing material to the semiconductor light emitting element.

The manufacturing method of the present invention is preferably arranged such that the step (i) includes the sub-steps of: (1) detecting a remaining amount of the fluorescence-containing material by a remaining amount detection section; and (2) adjusting, by a material injection amount adjustment section, an amount of the fluorescence-containing material supplied to the shaping template, in accordance with the remaining amount detected in the step (1).

According to this arrangement, in accordance with the remaining amount of the fluorescence-containing material detected by the remaining amount detection section, the material injection amount adjustment section can adjust an amount of the fluorescence-containing material supplied to the shaping template. It is therefore possible to apply the fluorescence-containing material without changing the mixture ratio from start to finish.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:
1. An injection apparatus comprising:
a storage section containing a fluorescence-containing material comprising both resin and fluorescent material; and
at least one equalization section configured to restrain disproportion in a mixture ratio of contaminants in the fluorescence-containing material, the at least one equalization section being a stirring section configured to stir the fluorescence-containing material in the injection apparatus, the stirring section being either propeller-shaped blades with a drive device or a dividing wall with a hole, said at least one equalization section comprising:
a remaining amount detection section arranged such that light is applied to the fluorescence-containing material and an amount of reflected light from the fluorescence-containing material is detected by a light-receiving element so that a remaining amount of the fluorescence-containing material is detected; and
a material injection amount adjustment section configured to adjust an amount of the fluorescence-containing material supplied to a shaping template in accordance with the remaining amount of fluorescence-containing material detected by the remaining amount detection section,
wherein the injection apparatus is configured to (i) inject the fluorescence-containing material into the shaping template for screen printing and (ii) cooperate with a manufacturing apparatus configured to apply, by screen printing, the fluorescence-containing material onto a semiconductor light emitting element in a package of a semiconductor light emitting apparatus.

2. The injection apparatus as defined in claim 1, wherein said at least one equalization section comprises a temperature control section which adjusts a temperature in the injection apparatus to be at a predetermined temperature.

3. The injection apparatus as defined in claim 2, wherein the temperature control section keeps the temperature in the injection apparatus at a temperature not lower than 10° C. and not higher than 30° C.

4. The injection apparatus as defined in claim 1, wherein the injection apparatus is filled with an inactive gas.

5. The injection apparatus as defined in claim 1, wherein the fluorescence-containing material includes at least one translucent resin selected from silicone resin, epoxy resin, acrylic resin, fluoric resin, polyimide resin, and modified silicone epoxy resin.

6. The injection apparatus as defined in claim 1, wherein the fluorescence-containing material includes at least one fluorescent material selected from: YAG (yttrium aluminum garnet) fluorescent material to which gadolinium and cerium are added; BOS (barium ortho-silicate) fluorescent material; and TAG (terbium aluminum garnet) fluorescent material.

7. A manufacturing apparatus, comprising:
a shaping template for screen printing; and
an injection apparatus including
  (i) a storage section containing a fluorescence-containing material comprising both resin and fluorescent material and
  (ii) at least one equalization section configured to restrain disproportion in a mixture ratio of contaminants in the fluorescence-containing material, the at least one equalization section comprising (a) a stirring section configured to stir the fluorescence-containing material in the injection apparatus, the stirring section being either propeller-shaped blades with a drive device or a dividing wall with a hole, (b) a remaining amount detection section arranged such that light is applied to the fluorescence-containing material and an amount of reflected light from the fluorescence-containing material is detected by a light-receiving element so that a remaining amount of the fluorescence-containing material is detected, and (c) a material injection amount adjustment section configured to adjust an amount of the fluorescence-containing material supplied to a shaping template in accordance with the remaining amount of fluorescence-containing material detected by the remaining amount detection section,
wherein the manufacturing apparatus is configured to apply, by screen printing, the fluorescence-containing material onto a semiconductor light emitting element in a package of a semiconductor light emitting apparatus.

8. The manufacturing apparatus as defined in claim 7, further comprising:
at least one pressure adjustment device which changes gas pressure in the manufacturing apparatus,
the shaping template, the injection apparatus, and the pressure adjustment device being provided in a single closed space.

9. The manufacturing apparatus as defined in claim 7, wherein the pressure adjustment device is an airbag which inflates so as to increase the gas pressure in the manufacturing apparatus and deflates so as to decrease the gas pressure in the manufacturing apparatus.

* * * * *